United States Patent [19]
Chang

[11] Patent Number: 5,825,061
[45] Date of Patent: Oct. 20, 1998

[54] CHANNEL-TYPE STACK CAPACITOR FOR DRAM CELL

[75] Inventor: Su-Jaw Chang, Hsin-Chu, Taiwan

[73] Assignee: Utron Technology Inc., Hsin-Chu, Taiwan

[21] Appl. No.: 568,245

[22] Filed: Dec. 6, 1995

[51] Int. Cl.[6] .......................... H01L 27/108; H01L 29/76; H01L 29/94; H01L 31/119

[52] U.S. Cl. .......................... 257/309; 257/306; 257/307; 257/308

[58] Field of Search ..................................... 257/296, 306, 257/307, 308, 309

[56] References Cited

U.S. PATENT DOCUMENTS

| | | |
|---|---|---|
| 4,970,564 | 11/1990 | Kimura et al. . |
| 5,005,103 | 4/1991 | Kwon et al. . |
| 5,014,103 | 5/1991 | Ema . |
| 5,378,906 | 1/1995 | Lee .......................................... 257/296 |
| 5,591,998 | 1/1997 | Kimura et al. ........................... 257/306 |
| 5,604,365 | 2/1997 | Kajigaya et al. ........................ 257/296 |

*Primary Examiner*—Ngân V. Ngô
*Attorney, Agent, or Firm*—H. C. Lin

[57] ABSTRACT

The electrode of a storage capacitor of a DRAM cell lies diagonally along the memory cell. The diagonal layout makes the length of the capacitor longer than either the x-dimension or the y-dimension of the memory cell, thus increasing the storage capacitance.

12 Claims, 14 Drawing Sheets

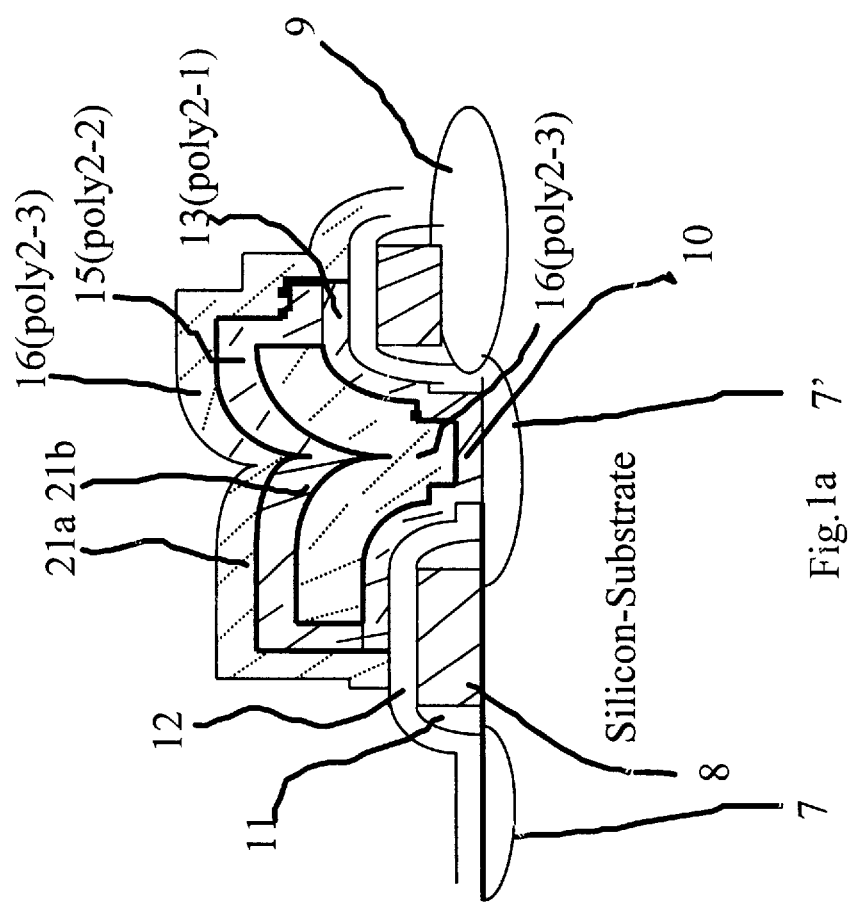

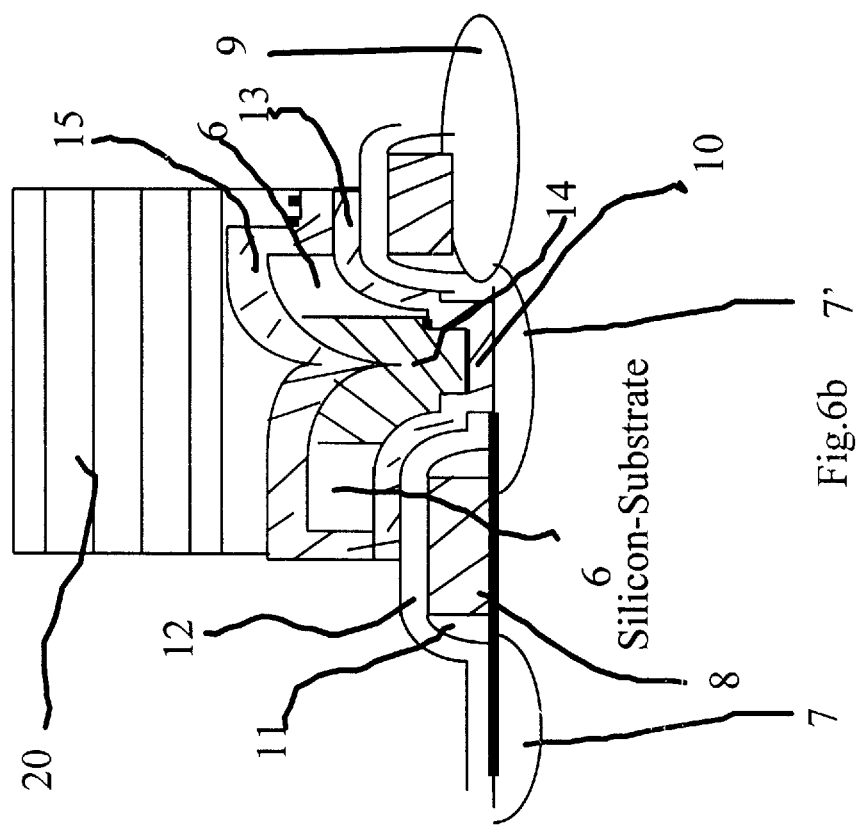

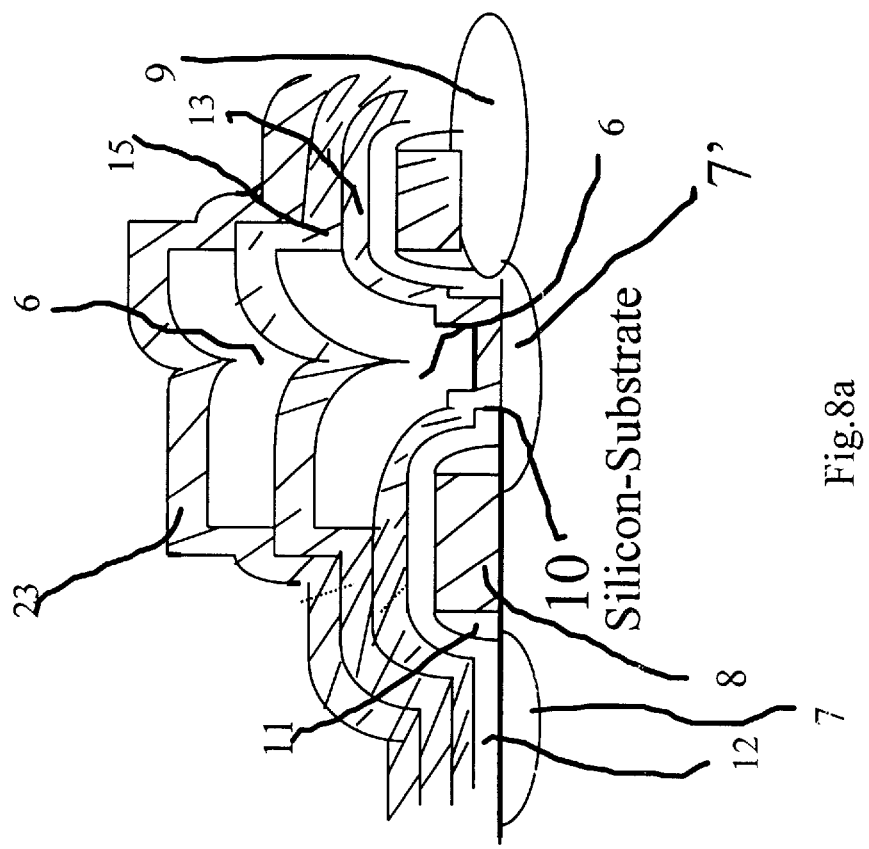

CHANNEL-TYPE STACK CAPACITOR FOR DRAM CELL

BACKGROUND OF THE INVENTION

This application relates to Dynamic Ramdon Access Memory (DRAM) cell for integrated circuits (IC), in particular the storage capacitor for the DRAM cell.

In a DRAM cell, it is desirable to reduce the size of a memory cell for increasing the memory capacity of an IC. Yet, the storage capacitance of the cell should be made large to increase charge storage. The requirements for small size and large storage capacitance are inconsistent.

To overcome the problem, various non-planar structures have been proposed. For instance, there have been proposed the side-wall capacitor structure as disclosed in U.S. Pat. No. 4,958,318, the stacked capacitor structure as disclosed in U.S. Pat. No. 5,413,950, etc. All these structures suffer from the lack of surface planarity and complicated processing, both of which reduce the production yield.

To overcome the planarity problems, a tunnel-shaped structure as disclosed in U.S. Pat. No. 5,262,663 has been proposed. The storage capacitor electrodes and the memory cell outlines are laid out in parallel, but such a layout sets a limit to the capacitance value as the capacitor electrode can be no longer than either the x-dimension or y-dimension of the memory cell.

SUMMARY OF THE INVENTION

An object of this invention is to construct a DRAM cell which is more planar than prior art. Another object is to construct a DRAM cell which has a more favorable capacitance to transistor area ratio than prior art. Still another object of this invention is to construct a DRAM cell which has very tolerant processing steps.

These objects are achieved in this invention by using a shell-type capacitor electrode with a core traversing diagonally from one memory cell to another memory cell. The area where the core overlays the bottom electrode becomes an extra capacitor area. The core can be hollow, filled totally or partially with dielectric material, or filled with polysilicon to serve as the second electrode of the capacitor. More than one shell-type structure can be stacked to further increase the storage capacitance.

BRIEF DESCRIPTION OF THE DRAWINGS

FIG. 1a shows the cross-section view of a DRAM cell based on the present invention along section A—A' of FIG. 3. FIG. 1b shows a modification of FIG. 1a. FIG. 1c shows another modification of FIG 1a.

FIG. 2b shows a modification of FIG. 2a.

FIG. 6b shows a modification of FIG. 6a.

FIG. 8a shows Step C3 in processing, and FIG. 8b shows a modification of FIG. 8a.

DETAILED DESCRIPTION OF THE PREFERRED EMBODIMENT

Figure 1B:
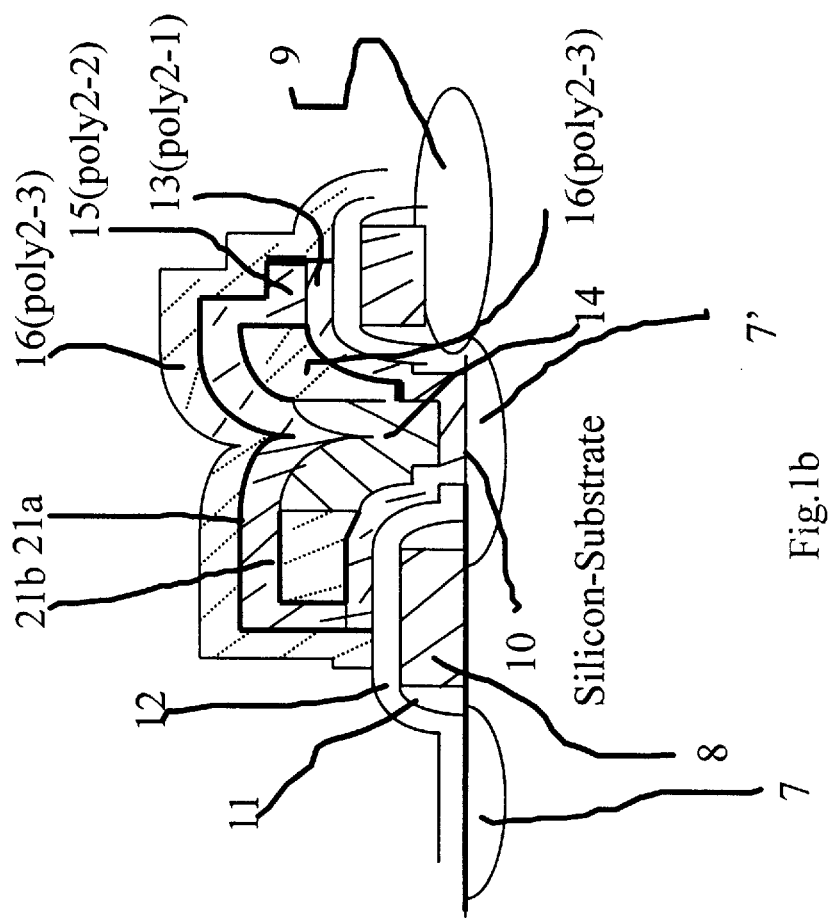

The basic structure of the present invention is shown in FIG. 1a in the case of an n-channel transfer gate. An n-type source or drain 7 is diffused in a p-type substrate. A transfer gate 8 lies over the channel region between the source and the drain through a gate oxide to constitute an MOSFET. Outside the active MOSFET region is the field oxide (FOX) 9. One of the n-type diffusions 7 is connected to a bit line through a bit-line contact. The other n-type diffusion 7' is connected to the bottom capacitor electrode 13 of polysilicon poly2-1 through contact 10. Except for contact area to the bit line from diffusion 7 and contact area 10 to the bottom electrode 13, the surface is first covered with an insulating layer 12. The bottom electrode is shaped like a clamped shell with a core 14 which elevates the upper side 15 of this bottom electrode. The upper shell 15 of polysilicon poly2-2 is clamped against the lower shell 13 to form the combined bottom electrode of the storage capacitor. The bottom electrode 15 forms the storage capacitor with the top electrode 16 of polysilicon poly2-3 through insulating layers 21a, 21b, 25a and 25b shown in heavy line. By elevating the upper side of the bottom electrode, the storage capacitance is increased by increasing the side-wall area, and the structure is made more planar, because the upper electrode no longer dips through a deep valley above the contact area 10 of the bottom electrode to the n-type diffusion.

Figure 1C:
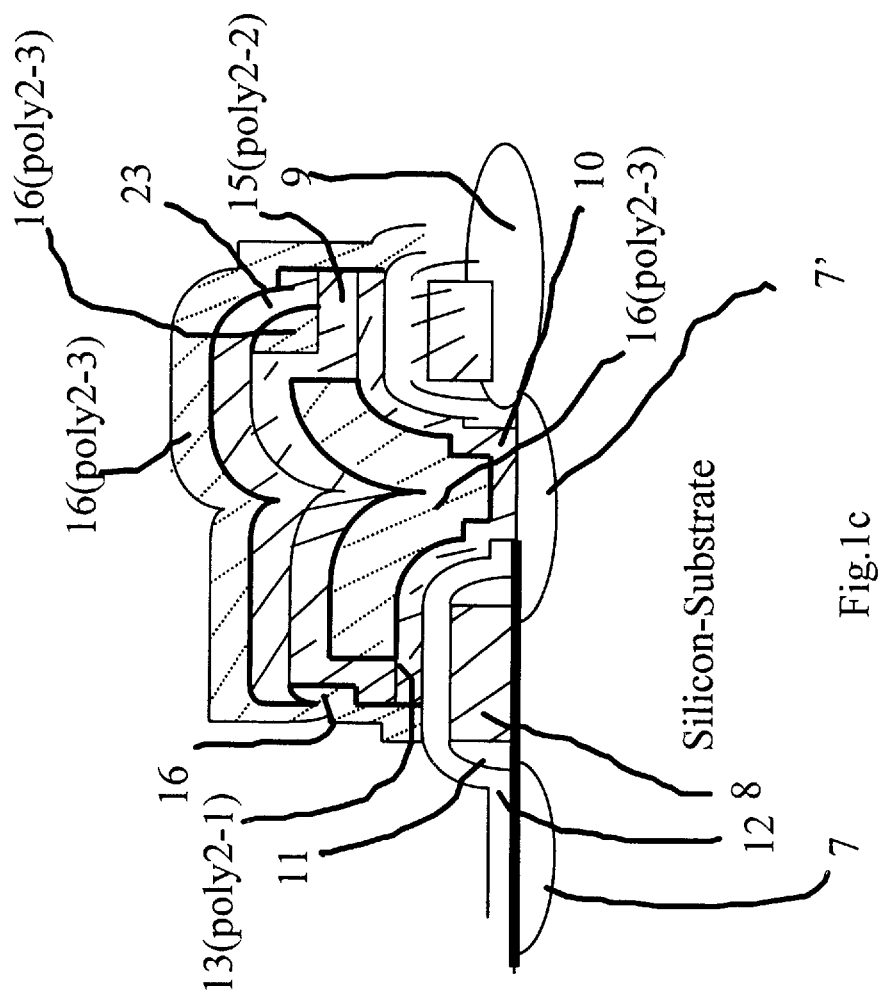

A modification of the structure shown in FIG. 1a is shown in FIG. 1c. In this modified structure, a spacer 27 is added outside the vertical side-wall of the upper side of the bottom electrode 13. This spacer creates more capacitor area without extra masking step, smooths out the vertical step for the top plate electrode 16 to cover, and improves its integrity.

Figure 2A:
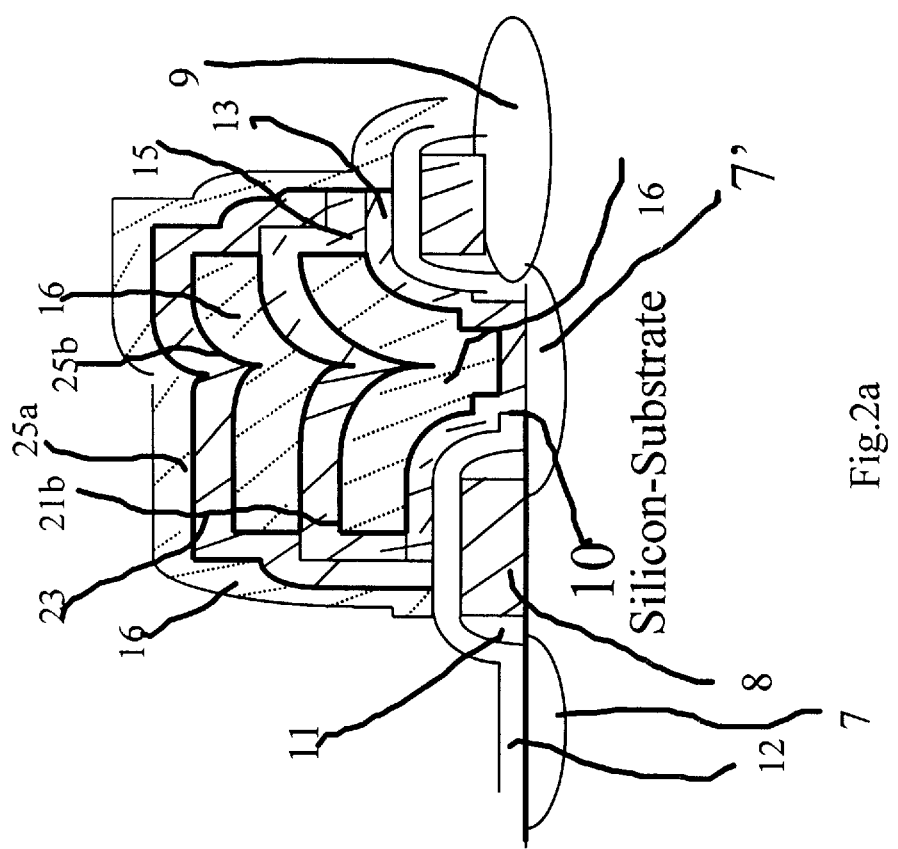
FIG. 2a shows the cross-section of a DRAM cell with stacked capacitor electrode based on the present invention along section A—A' of FIG. 3.

In another embodiment of the present invention as shown in FIG. 2a, a stacked structure is used for the storage capacitor. In this stacked structure, the bottom electrode and the top electrode of the capacitor interleave. The bottom electrode now has an additional fin with upper surface 25a and lower surface 25b. The top electrode then has an additional fin 24 sandwiched between the two upper fins of the bottom electrode. With this stacked structure, the storage capacitance is increased over that of FIG. 1a. The direction and the size of the two cores need not be the same.

Figure 3:
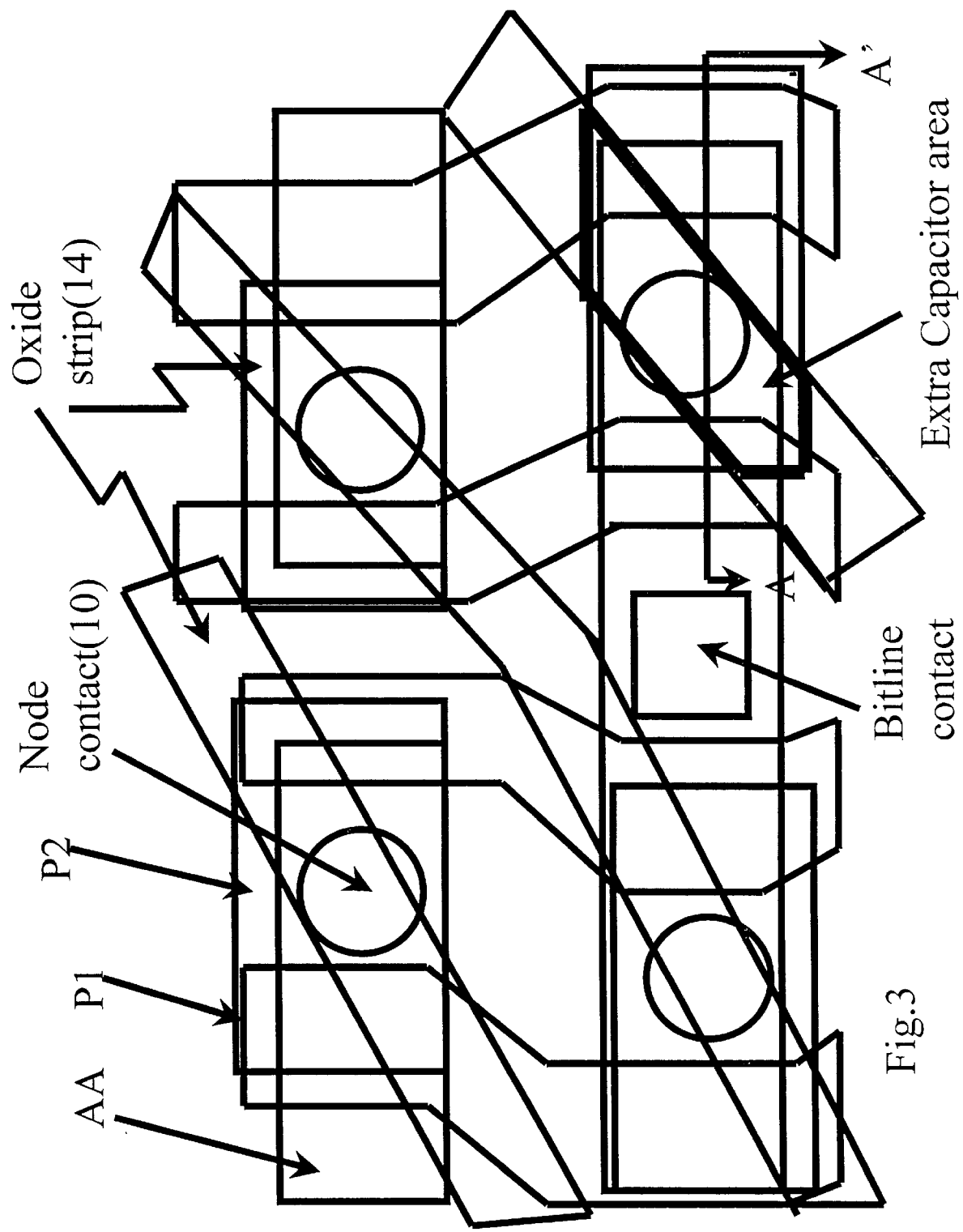
FIG. 3 shows the top view of a memory cell with diagonal capacitor electrode based on the present invention.

The core 14, which lies above the node contact 10, traverses diagonally or any direction other than the x-dimension or y-dimension of the memory cell like a tunnel from one memory cell to another memory cell as shown in FIG. 3. This tunnel is at an oblique angle with the memory cell alignment. As the core defines the increased area of the storage capacitor, the diagonal tunnel offers more capacitance than a tunnel which traverses either in the x-direction or the y-direction as depicted by the shaded area in FIG. 3. As is well-known in trigonometry, the hypotenuse L of a right-angled triangle is equal to square root of $(X^2+Y^2)$, where X and Y are respectively the x-dimension and y-dimension of the memory cell.

If the diagonal length of the tunnel per cell is L; the width, W and the height, H, then the increase in capacitance per cell over the contact area is approximately equal to $2(LW+LH)$. For a typical 1.5 $\mu$m by 0.8 $\mu$m planar capacitor area, the increase in capacitance area is approximately 2 $\mu m^2$ or 10 fF.

Figure 2B:
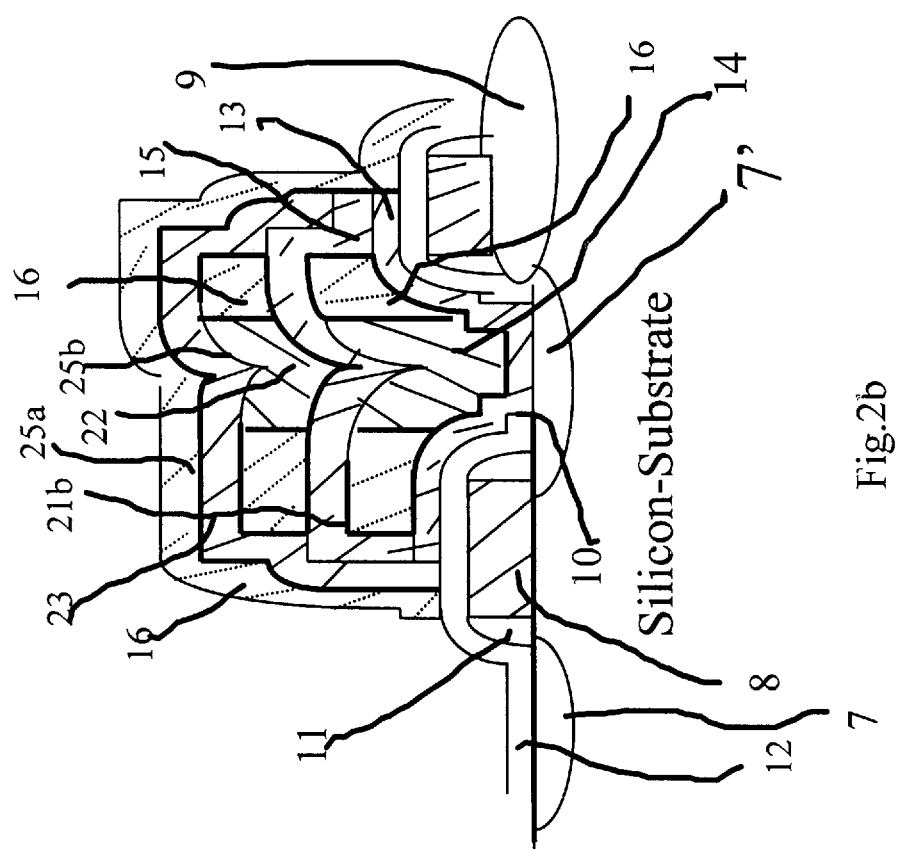

The core 14 can be hollow, filled totally or partially with dielectric material, or filled totally or partially with polysilicon poly2-3 which forms a part of the upper electrode of the storage capacitor. FIG. 1b and FIG. 2b show modified structures of FIG. 1a and FIG. 2a respectively with partially filled cores. With dielectric cores, the dielectric material may be a doped or undoped oxide. When polysilicon is used as core material in FIG. 2b, the polysilicon of the two cores can be connected together outside the two core regions. The material of the two cores need not be the same.

The structures shown in FIGS. 1a, 1b and 2 can be processed in a variaty of methods according to this invention. These methods are classified into five different processes. Each process includes four or five steps as tabulated in the following table:

|  | Step 1 | Step 2 | Step 3 | Step 4 | Step 5 |
| --- | --- | --- | --- | --- | --- |
| Process 1 | A | B | C1 | D1 |  |
| Process 2 | A | B | C1' | D1' |  |
| Process 3 | A | B | C2 | D2 | E2 |
| Process 4 | A | B | C1' | D2' | E2' |
| Process 5 | A | B | C3 | D3 | E3 |

Figure 4:
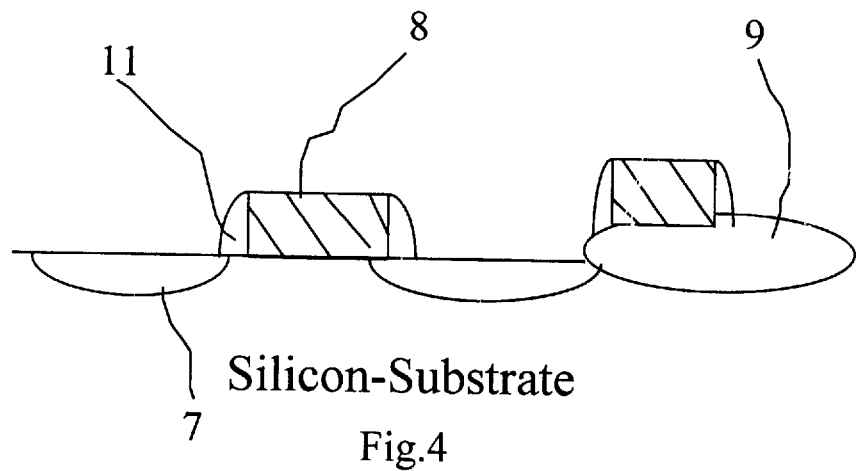
FIG. 4 shows the cross-section view of a memory cell before the storage capacitor is processed (Step A).

Each of the foregoing steps will be described as follows:

Step A (FIG. 4): LOCOS process (i.e. selective local oxidation using silicon nitride masking) is used to define the active area and the device isolation area. The active area includes the transfer transistor with n-type 7' diffusions 7, a first polysilicon poly1 gate 8 and spacers 11 for low doped drain (LDD) construction. The isolation area includes a thick field oxide 9.

Figure 5:
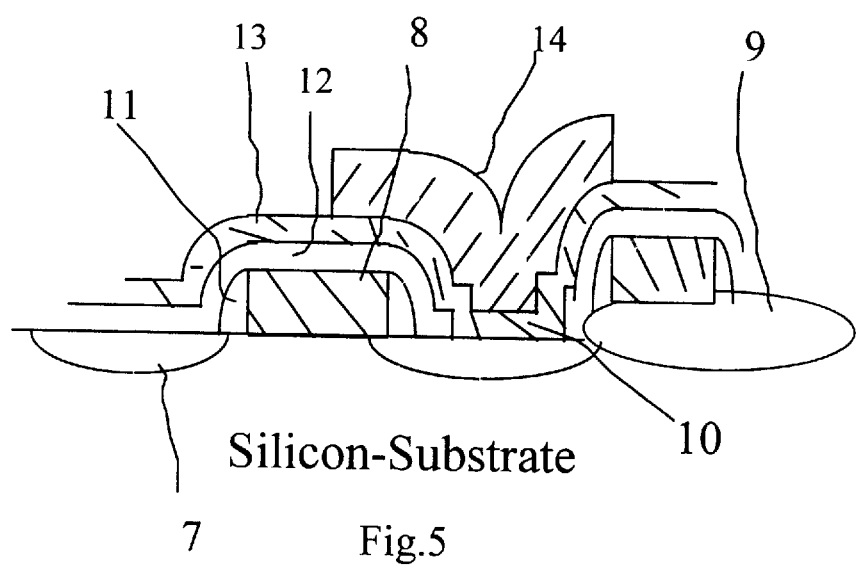
FIG. 5 shows Step B in processing.

Step B (FIG. 5): A 0.1–0.2 $\mu$m TEOS (tetraethoxysilane) oxide 12 is deposited for isolation between poly1 (8) and the bottom poly2-1 electrode 13 of the storage capacitor. Then, a node contact 10 is opened. First bottom electrode of the storage capacitor is deposited with a second polysilicon poly2-1 layer 13 >600 Å thick. A doped or undoped oxide 14, few thousand A thick, is deposited on top of the wafer. If a doped oxide 14 is used, high temperature anneal before or after oxide patterning can be used to planarize the topography. The TEOS oxide 14 is then patterned by wet or dry etching to a width of >0.4 $\mu$m in stripe shape, which runs in any direction one may desire.

Figure 6A:
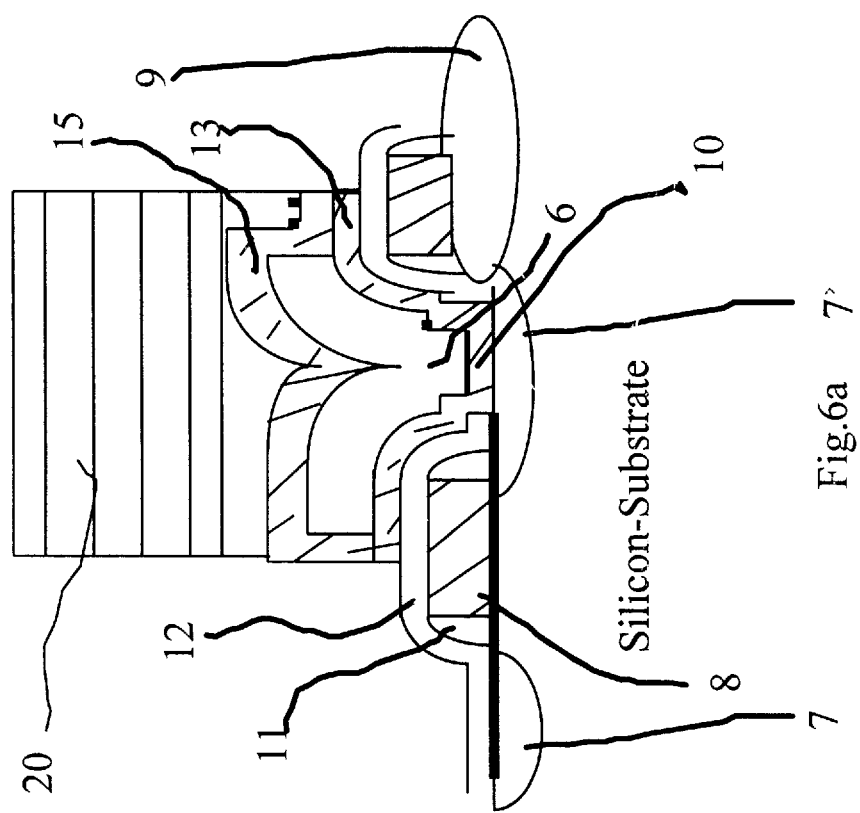
FIG. 6a shows Step C1 in processing.

Step C1/C' (FIGS. 6a/6b): A second bottom electrode poly2-2 (15) is deposited and patterned with an overetch insufficient to remove completely poly2-1 (13) but clear out poly-Si on top of oxide 14. The photoresist 20 is left on. Next, the oxide 14 is dipped in dilute hydrofluoric acid (HF) or buffer oxide etcher (BOE) tank to obtain a desired depth inside the core of the tunnel. If the TEOS oxide is completely removed, a hollow core 6 or a notch 6' is formed between poly2-1 (13) and poly2-2 (115). Then poly2-1 and poly2-2 are etched to define the bottom electrode and photoresist 20 is stripped away. The core can be totally filled as shown in FIG. 6a or partially filled as shown in FIG. 6b.

Step D1/D1' (FIGS. 1a/1b): Conventional ONO (silicon oxide-silicon nitride-silicon oxide) process is applied to form the dielectric of the storage capacitor, which is deposited on the outer surface (21a) and inner surface (21b or 21b') of poly2-1 (13) and poly2-2 (15). LP-CVD doped polysilicon 16 is then deposited on the wafer, fills into the core 6 or 6' of the tunnel, and patterned to form the top electrode of the capacitor.

Figure 7:
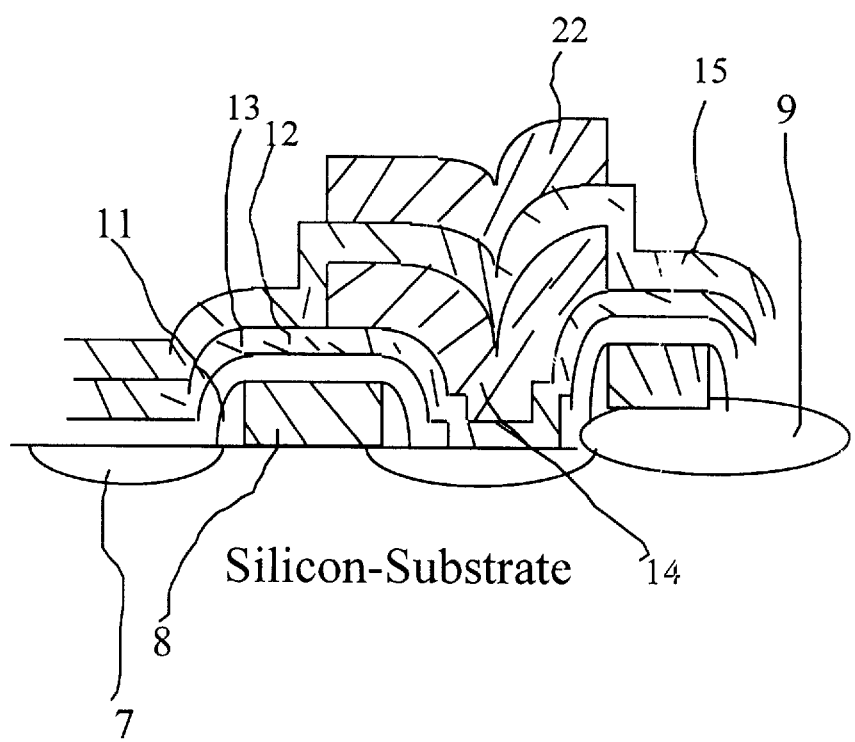
FIG. 7 shows Step C2 in processing.

Step C2 (FIG. 7): Poly2-2 (15) is deposited and followed by a second core oxide 22. The core oxide 22 is patterned with the same or different mask as the first core oxide 14. These two procedures can be repeated many times if a very large capacitance is required.

Figure 8B:
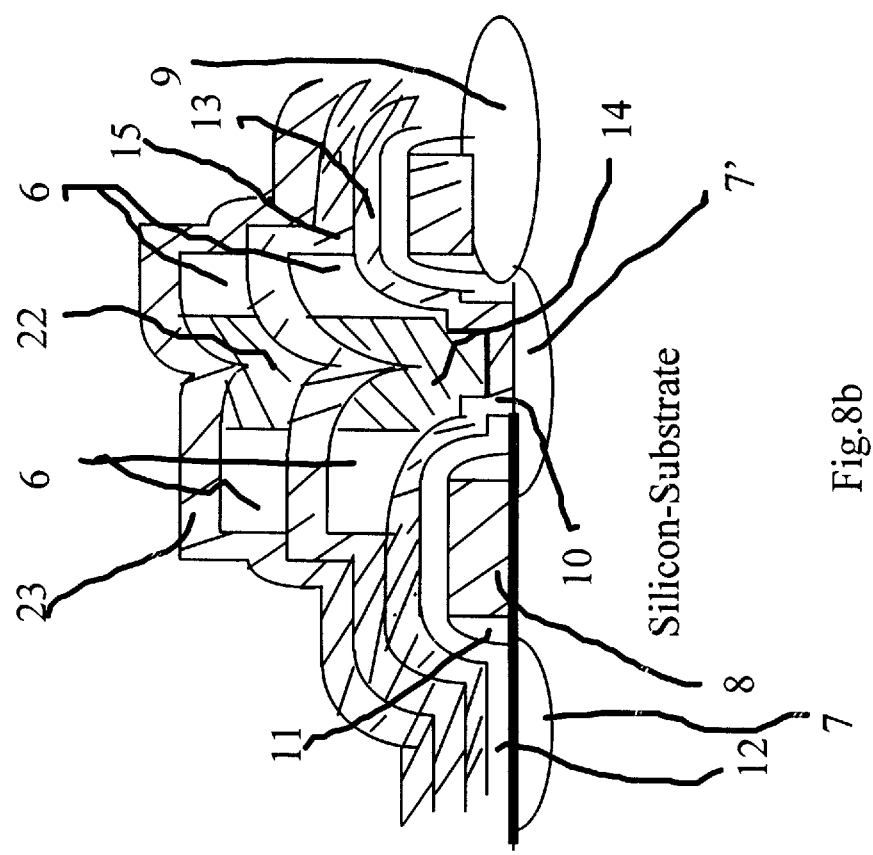

Step D2/D2' (FIGS. 8a/8b): Doped poly2-3 (23) is deposited and patterned with bottom electrode mask. Poly2 layers 13, 15 and 2.3 are etched so that there is only a thin blanket of poly2-1 (13) left covering all over the wafer and some surfaces of oxide 14 and 22 are exposed. Oxide 14 and 22 is dipped in dilute HF or BOE tank to any desired depth inside the core of the tunnel. If the oxide is completely removed, a totally hollow core 24 is formed between poly2-2 (15) and poly2-2 (23). Then poly2-1 (13), poly2-2 (15) and poly2-3 (23) are etched clearly to define the bottom electrode and the photoresist is stripped away. The core can be totally filled as shown in FIG. 8a, or partially filed as shown in FIG. 8b.

Step E2/E2' (FIGS. 2a/2b): Conventional thin ONO process is applied to form the dielectric of the storage capacitor, which grows on the outer surface 25a and inner surfaces 21b and 25b of poly2-1 (13), poly2-2 (15) and poly2-3 (23). LP-CVD doped polysilicon 16 is deposited on the wafer, fills into the cores 6, 24, and is patterned to form the top electrode of the capacitor.

Figure 9:
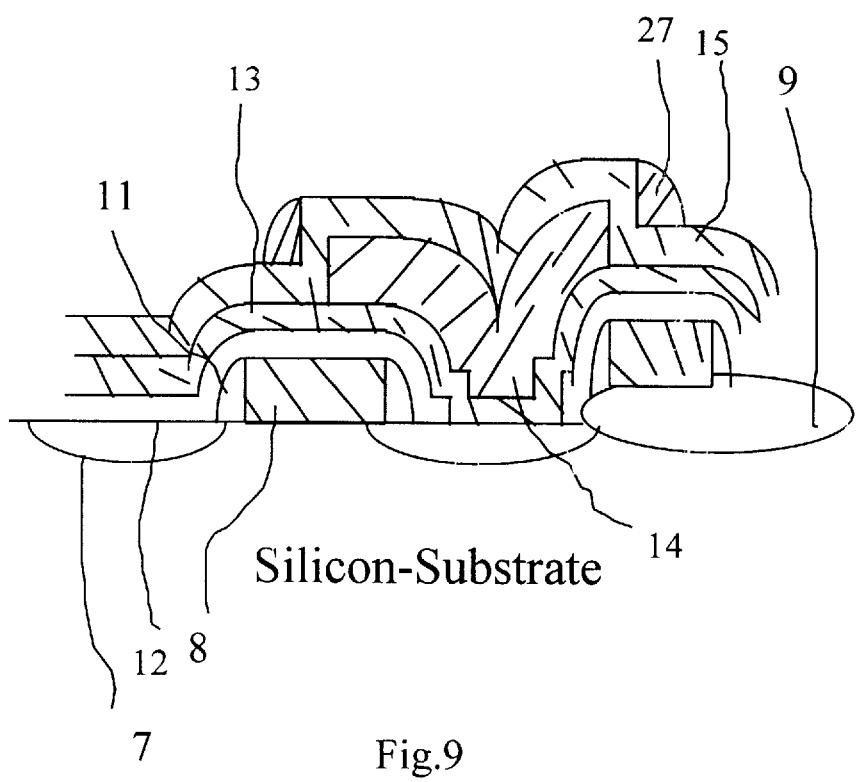
FIG. 9 shows Step D2 in processing.

Step C3 (FIG. 9): Poly2-2 (15) is deposited. Then a spacer channel oxide 27 is formed at the side-wall of poly2-2 (15) along TEOS oxide 14. Note that a smaller parasitic spacer 30 is formed along word line 8.

Figure 10:
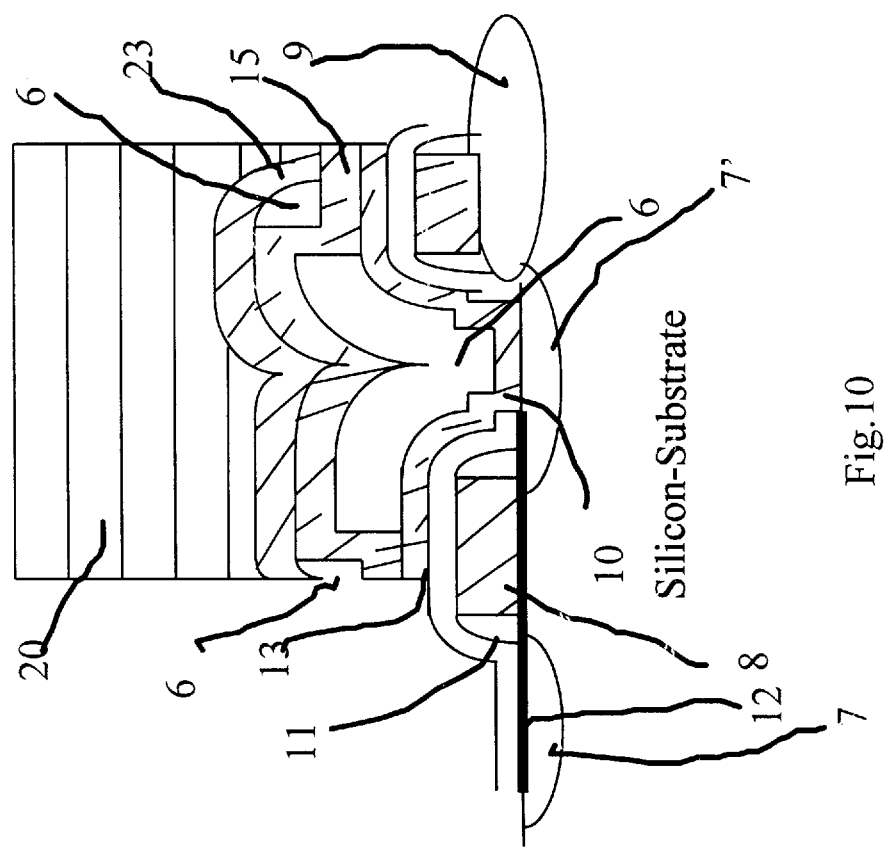
FIG. 10 shows Step D3 in processing.

Step D3 (FIG. 10): Doped poly2-3 (23) is deposited and patterned with bottom electrode mask 20. Poly2-1 (13), poly2-2 (15) and poly2-3 (23) are etched so that there is only a thin blanket of poly2-1 (13) left covering all over the wafer and surfaces of oxide 14, 27 and 30 are exposed. Oxide 14, 27 is dipped in dilute HF or BOE tank to a desired depth in the cores. If it is completely removed, a totally hollow core 6, 28 is formed between poly2-1(13) and poly2-2 (15), and between poly2-2 (15) and poly2-3 (23). The parasitic spacer 30 is stripped off and does not require a mask to etch. The poly2-1 (13), poly2-2 (15) and poly2-3 (23) are etched clearly to define the bottom electrode, and photoresist is stripped away.

Step E3 (FIG. 1c): Conventional thin ONO process is applied to form the dielectric of the capacitor which grows on the outer surface 21a and inner surfaces 21b, 29 of poly2-1 (13), poly2-2 (15) and poly2-3 (23). LP-CVD polysilicon 16 is then deposited on the wafer, fills in the cores 6, 28 of the tunnel and is patterned to form the top electrode.

The advantages of the foregoing structures and processes are as follows:

1. The capacitor area is increased. For example, using 0.5 $\mu$m DRAM technology, a conventional stack cell has: poly2=5kA and top area=1.2 $\mu m^2$, total area=3.4 $\mu m^2$, which is marginal to operate or requires a very thin dielectric. With the present invention, (FIG. 1a), poly2-1=1kA, poly2-2= 2kA, core oxide of tunnel=3kA, width=0.5 $\mu$m, the net increased area=2.4 um$^2$ (extra 70% are added).

2. Simple processing steps are used with only one more mask than conventional stacked cell. No sacrificial silicon nitride and hot phosphoric acid are used.

3. Decreased height and topography is achieved because it is not necessary to use very thick poly2 to get large stacked surface area for satisfactory capacitance. (High stacked capacitors result in unfavorable topography within a chip, which in turn reduces focus margin for lithography and increases etch residue. Then manufacturing yield suffers.)

4. Increased capacitance is not sensitive to masking mis-salignment of core oxide layer with reference to the poly2 layer. The risk to lose some bits of data is greatly reduced.

5. Capacitor area can be increased further by providing more core oxide on poly2.

6. In Step E3, no extra masking step is needed to create more capacitor area.

While the foregoing embodiment refers to a memory cell with a p-type substrate, it is understood that the structure applies equally well to a memory cell using an n-type substrate.

What is claimed is:

1. A storage capacitance for dynamic random access memory (DRAM) celL having a word line connected to a gate electrode of a MOSFET, a bit line serving as a first diffusion of said MOSFET, a first electrode of said capacitor connected to a reference potential, comprising:

a second electrode of said capacitor connected to a second diffusion of said MOSFET, separated from said first electrode by a dielectric layer, and having a cross-section in the form of at least one shell enclosing a core of a material which can be different from the material for said second electrode, said core traversing from one said memory cell to another said memory in a direction other than the horizontal and vertical dimensions of a rectangular shaped said memory cell.

2. A storage capacitor for a DRAM cell as described in claim 1, wherein said core traverses diagonally from one said memory cell to another said memory cell.

3. A storage capacitor for a DRAM cell as described in claim 1, wherein the material for said first electrode and said second electrode is polysilicon.

4. A storage capacitor for a DRAM cell as described in claim 1, wherein said core is filled with dielectric material.

5. A storage capacitor for a DRAM cell as described in claim 1, wherein said core is partially filled with dielectric material.

6. A storage capacitor for a DRAM cell as described in claim 1, wherein said core is hollow.

7. A storage capacitor for a DRAM cell as described in claim 1, wherein said core is partially filled with said first electrode.

8. A storage capacitor for a DRAM cell as described in claim 1, wherein one said shell is stacked with another said shell.

9. A storage capacitor for a DRAM cell as described in claim 8, wherein the material of said core of one of said shell is the same as the material of said core of another said shell.

10. A storage capacitor for a DRAM cell as described in claim 8 wherein the direction of said core of one of said shell is different from the direction of the core of another said shell.

11. A storage capacitor for a DRAM cell as described in claim 8, wherein the area of said core of one said shell is different from the area of the core of another said shell.

12. A storage capacitor for a DRAM cell as described in claim 1, wherein an insulating spacer is placed around said shell.

* * * * *